United States Patent [19]

Harmon et al.

[11] Patent Number: 5,118,384
[45] Date of Patent: Jun. 2, 1992

[54] REACTIVE ION ETCHING BUFFER MASK

[75] Inventors: David L. Harmon, Essex; Michael L. Kerbaugh, Burlington; Nancy T. Pascoe, South Burlington; John F. Rembetski, Burlington, all of Vt.

[73] Assignee: International Business Machines Corporation, Armont, N.Y.

[21] Appl. No.: 807,960

[22] Filed: Dec. 10, 1991

Related U.S. Application Data

[63] Continuation of Ser. No. 504,197, Apr. 3, 1990, abandoned.

[51] Int. Cl.$^5$ .............. H01L 21/306; B44C 1/22; C03C 15/00; C03C 25/06
[52] U.S. Cl. .................. 156/643; 156/646; 156/653; 156/657; 156/661.1; 156/662; 156/904; 204/192.37
[58] Field of Search .............. 156/643, 644, 646, 647, 156/648, 651, 653, 657, 659.1, 661.1, 668, 662, 904; 204/192.32, 192.37, 192.36; 437/225, 228, 233, 238, 241; 252/79.1

[56] References Cited

U.S. PATENT DOCUMENTS

| | | | |
|---|---|---|---|
| 4,502,914 | 3/1985 | Trumpp et al. | 156/648 X |
| 4,534,826 | 8/1985 | Goth et al. | 156/643 |
| 4,546,538 | 10/1985 | Suzuki | 29/576 |
| 4,630,356 | 12/1986 | Christie | 29/576 W |
| 4,666,556 | 5/1987 | Fulton et al. | 156/648 X |
| 4,786,615 | 11/1988 | Liaw et al. | 437/89 |
| 4,926,233 | 5/1990 | Hutter | 357/43 |
| 5,027,172 | 6/1991 | Jeon | 357/23.6 |

FOREIGN PATENT DOCUMENTS

0272143 6/1988 European Pat. Off. .
60-83331 9/1985 Japan .

OTHER PUBLICATIONS

B. M. Kemlage, et al. "Fabrication of Oxide Isolation Using an Oxynitride/Polysilicon Mask", *IBM Tech. Disclosure Bulletin,* vol. 24, No. 9 (Feb. 1982).
"Narrow Width Effects of Shallow Trench-Isolated CMOS with n+− Polysilicon Gate"—IEEE Transaction on Electron Devices, vol. 36, No. 6.
"Trench Framed Recessed Oxide Isolation" IBM Technical Disclosure Bulletin, vol. 24, No. 118 (Apr., 1982).

*Primary Examiner*—William A. Powell
*Attorney, Agent, or Firm*—Calfee, Halter & Griswold

[57] ABSTRACT

An improved mask and method of forming a deep and uniform width trench in a substrate and the resulting structure is disclosed. A substrate material such as silicon has deposited thereon a first layer of sacrificial material as a first component of an etch mask, the sacrificial material being a material such as polysilicon that is either etched by or absorbs the same ions which reactively ion etch the substrate. A second layer of material, which resists reactive ion etching, such as silicon dioxide, is deposited over the first layer of material as a second component of the etch mask. The silicon dioxide is patterned in the form of the trench to be formed in the substrate. The layer polysilicon material is then reactive ion etched and the reactive ion etching continued to form a trench in the silicon substrate. The polysilicon acts as a sacrificial material being etched by any ions that are reflected from the silicon dioxide or are directed at an angle such that they strike the layer of polysilicon material. Thus, only those ions which are directed essentially normal to the underlying substrate perform the trench etching. This allows the trench to have essentially straight side walls and to be of essentially uniform width.

9 Claims, 1 Drawing Sheet

REACTIVE ION ETCHING BUFFER MASK

This is a continuation of copending application Ser. No. 07/504,197 filed on Apr. 3, 1990, abandoned.

BACKGROUND OF THE INVENTION

This invention relates generally to etching of semiconductor substrates, and more particularly to a method of reactive ion etching deep trenches in a silicon substrate using a composite mask which allows etching to produce essentially straight uniform trench sidewalls.

BACKGROUND ART

In conventional high aspect ratio, i.e. deep and narrow, trench etching in silicon or other semiconductor substrates using conventional oxide or other dielectric masks, trench bowing or unsmooth trench walls result due to angular ion bombardment. This bowing can be somewhat alleviated by passivation of the side walls during etching by forming silicon dioxide during etching which adheres to the side walls and prevents bowing. However, this passivation layer tends to neck down at the top end of the trench. This type of passivation and necking down results in a tapering or non uniform width of the trench as it progresses farther into the silicon substrate. Both of these conditions are normally detrimental to the end product, it being desirable to have the sidewalls as straight and as uniform in width as possible from top to bottom in most instances.

There exist prior art teachings relating to various steps for trench etching as well as other types of etching which are exemplified by: U.S. Pat. No. 4,546,538 which relates to forming trenches in silicon by utilizing multiple layers of oxide, nitride and polysilicon as a mask; U.S. Pat. No. 4,786,615 which relates to growing of epitaxil silicon by forming an oxide-polysilicon-oxide mask; and U.S. Pat. No. 4,534,826 which relates to forming trenches in silicon by defining oxide-nitride and oxide masks. However, none of these references provide a patterned dual layer mask which includes a lower polysilicon layer and an upper oxide layer whereby during reactive ion etching (RIE) the polysilicon component layer of the mask is partially etched as a sacrificial buffer layer to absorb during RIE these ions which are not directed perpendicularly to the substrate and allowing only those ions directed perpendicularly to the substrate to perform the etching function on the substrate. This provides a deep trench in the substrate of uniform width, unbowed at the top.

SUMMARY OF THE INVENTION

According to the present invention, an improved method of forming an essentially uniform width deep trench in a substrate is provided. A layer of material is formed on the substrate that will react with or absorb the same ions which will react with the substrate to etch the substrate thus forming a first layer of the etch mask. A second layer of the etch mask material is formed over the first layer of material and patterned to define the location and width of the trenches to be etched in the substrate. Thereafter, the material in the first layer of the mask is reactive ion etched through the patterned exposed second layer of etch mask with the reactive ion etching continuing into the substrate therebelow to form trenches. In this process, the exposed first layer of mask material beneath the second layer of mask material absorbs essentially non-vertically travelling ions, allowing only essentially vertically travelling ions to etch the substrate to form a trench in the substrate of essentially uniform width. Thereafter, both layers of the etch masking material may be removed.

DESCRIPTION OF THE PREFERRED EMBODIMENT

According to the present -invention, an improved method of forming a deep trench in a substrate and particularly a silicon substrate for semiconductor device fabrication is provided. The method incorporates the formation of a layer of sacrificial material on top of the substrate as a first component of an etch mask and an etch resisting material overlying the sacrificial material to form a second component of the etch mask, the first and second component layers of material together functioning as a composite etch mask for reactive ion etching of the substrate. The sacrificial material is selected such that it absorbs the same ions that perform the reactive ion etching of the substrate so that any ions that are reflected from the etch resisting layer of the etch mask are directed at such an angle that they strike the first or sacrificial material. Also, ions that are at just a slight angle to vertical impinge directly on the first or sacrificial layer and these, together with the reflected ions, are absorbed by the sacrificial material thereby actually etching the sacrificial material. These slightly angled ions are not reflected down to the substrate, and thus, only the etching ions which are directed essentially vertically or normal to the surface of the substrate are passed through the composite etch mask, and the etching of the trench in the substrate will result in the trench having essentially uniform side walls without any bowing at the top which is normally encountered in conventional prior art etching processes. This allows use of conditions where minimal sidewall passivation is formed in the etching plasma, resulting in vertical trench walls.

Figure 1:
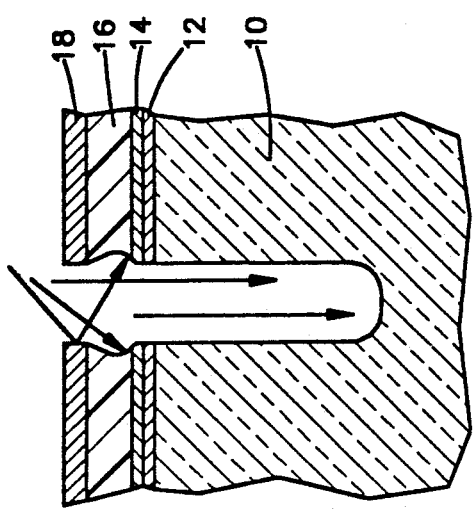
FIG. 1 is a cross-sectional view somewhat diagramatic of a semiconductor substrate having various layers formed thereon ready for patterning and reactive ion etching according to this invention.

Referring now to the drawing, FIG. 1 shows a conventional silicon substrate 10 having a thin layer of thermal oxide 12 grown thereon over which is deposited a layer of silicon nitride 14. On top of the silicon nitride layer 14, a layer of polysilicon 16 is deposited which will act as a sacrificial material, as will be described presently. On top of the polysilicon layer 16, a layer of CVD (chemically vapor deposited) oxide mask 18 is deposited; and finally, a layer of photoresist 20 is deposited on top of the oxide 18. The polysilicon component layer 16 and oxide component layer 18 together function as a composite etch mask.

The various processes for growing thermal oxide 12, depositing the nitride layer 14, depositing a polysilicon layer 16 and the oxide layer 18 as well as applying the photoresist 20 are conventional. For example, the thermal oxide can be grown in a furnace by a batch wet process at about 800° C. Typically, this layer of thermal oxide 12 will be grown to a thickness of about 150 Angstroms. The silicon nitride layer 14 can be deposited by a conventional CVD process to a thickness of about 1600 Angstroms. This can be done in a commercially available tool such as a batch CVD process using silane and ammonia in a ratio of about 1 to 10, and can be done typically at 770° C. at about 0.6 Torr.

The layer of polysilicon 16 can also be deposited in a batch CVD process. This can be done in a silane atmosphere at about 620° C. at about 0.6 Torr. The thickness of this polysilicon layer 16 can vary but it has been found that a preferred thickness is about 3 $\mu$m when a trench of about 10 $\mu$m of a width of about 0.5 $\mu$m is to be etched in the substrate which provides sufficient thickness to insure any non-vertical or reflected ions during the etching are captured, yet is thin enough to be readily removed as will be described presently. Also, this thickness will vary depending upon the time required for etching as will also be described presently.

The layer of CVD oxide 18 is deposited to a thickness of about 1.2 $\mu$m and this also can be done by a CVD batch process using tetraethoxysilane (TEOS) and $O_2$ at about 620° C. at 0.6 Torr. Other deposition processes such as thermal type wet batch process can also be employed.

At this point, conventional cleaning operations can be performed following which a layer of positive photoresist 20 is applied onto oxide layer 18. Any conventional type of photoresist may be applied. Optionally, a layer of resist adhesion promoting film (not shown) can be applied directly over the oxide 18, and the resist 20 applied thereon if adhesion promotion is required. The resist 20 typically is of a thickness of about 1-1.5 $\mu$m. The application, patterning and developing of photoresists is well known, and need not be described in detail herein.

Figure 3:
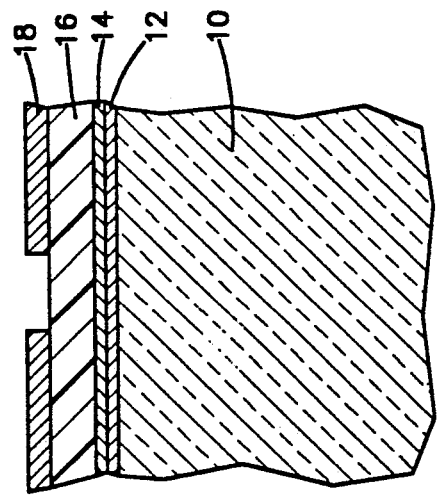
FIG. 3 is a view similar to FIG. 2 with the etching having been performed in the $SiO_2$ layer of the mask.
Figure 2:
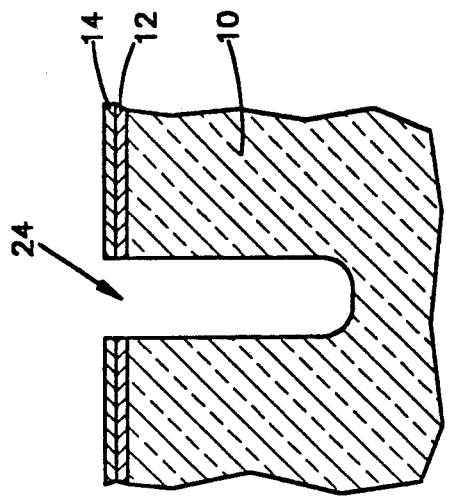
FIG. 2 is a view similar to FIG. 1 showing a pattern exposed and transferred to the masking layer.

The layer of photoresist 20 is then exposed to the desired pattern through a mask so as to expose the areas where trenches are to be formed and mask the other areas. The resist is then developed and baked to allow transfer of the pattern to the underlying oxide layer 18 as shown in FIG. 2. The structure at this point is now ready for forming the pattern into the oxide layer 18 to act as one layer of a composite etch mask. This is done by exposing the material in conventional oxide reactive ion etching atmosphere, for example, in a $CHF_3/CO_2$ atmosphere in an AME 8100 tool, the $CHF_3$ to $CO_2$ ratio being about 75 SCCM to about 8 SCCM, at about 40 mTorr pressure and about 1200 watts of power. This will etch through the oxide 18 forming a pattern therein. Following this, the resist layer 20 is stripped in a conventional manner such as $O_2$ atmosphere, at 300 Watts and 1.0 Torr for 60 minutes, resulting in the structure shown in FIG. 3.

Figure 4:
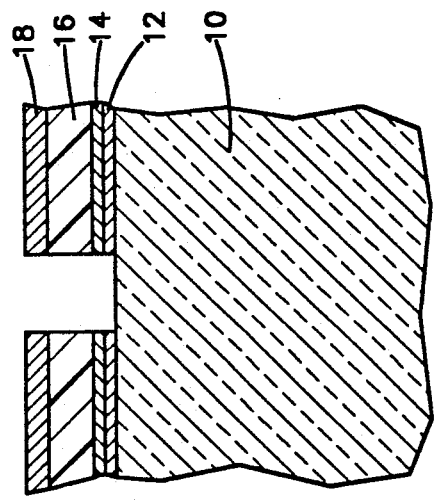
FIG. 4 is a view similar to FIG. 3 with the etching having been performed to the top of the substrate through the entire mask.

At this point, the materials are ready for reactive ion etching of the polysilicon layer 16. This can be done in a conventional manner and may be done in an AME 8100 tool. This process step uses HCl and $Cl_2$ gas in a ratio of about 90 SCCM of HCl to about 30 SCCM $Cl_2$ at about 15 mTorr and about 650 watts. This will cause an etching of the polysilicon 16. The etch process continues in the same etch tool in a $CF_4$ atmosphere, at about 100 SCCM at about 20 mTorr and about 850 watts to etch through the nitride layer 14 and the oxide layer 12, thus exposing the surface of the underlying silicon substrate 10 for trench etching. This point in the process is shown in FIG. 4.

The exposed portion of the substrate 10 is then etched to form the deep trench, with the oxide layer 18 and polysilicon layer 16 acting as a composite etch mask. (Of course, the thin layer of oxide 12 and nitride 18 have a minimal effect for etch masking.) The etching of the substrate 10 preferably is performed in an AME 5000 tool in an atmosphere of HBr at about 32 SCCM, $NF_3$ at about 5 SCCM, $SiF_4$ at about 5 SCCM and a mixture of helium and oxygen at a mixture ratio of about 90% Helium to about 10% Oxygen. This mixture of helium and oxygen is present optionally from 0 up to about 9 SCCM, the amount present being used to vary the effect on the side wall as will be described presently. The power can be set at about 450 watts and the pressure from about 50 to 100 mTorr with a magnetic field optionally from 0 to 80 Gauss. The trench 24 is formed by reactive ion etching in this tool using this mixture of gases to obtain essentially straight and parallel side walls. It is desirable to have the amount of helium/oxygen present at a minimum if at all and the magnetic field present at a minimum if at all, and the pressure at the lower end around 50 mTorr. At these minimum values, there will be little or no side-wall passivation of the trench by oxide formation, and the layer of polysilicon 16 will be sacrificially etched by off-normal ions. Nevertheless, some small degree of passivation may be desired. For example, free fluorine formed during etching may tend to isotropically etch the side wall causing some bowing. However, by providing a very thin layer (10-20 Angstroms) of passivating silicon dioxide, this etching by the fluorine can be prevented. Thus, it will be recognized by a person skilled in the art that these values may be varied to select the exact end results desired in forming the trench. Higher values, especially higher oxygen levels, will yield more side-wall passivation. As discussed above, side wall passivation takes place when etched silicon reacts with oxygen and adheres to the trench walls as silicon dioxide. As the etching progresses, this silicon dioxide will gradually pinch down near the top of the trench, which will restrict the width of the ion stream passing through, which in turn, results in a gradual tapering or narrowing of the trench toward its lower end. Thus, the amount of side wall passivation normally should be minimized to minimize or eliminate this side wall tapering.

Figure 5:
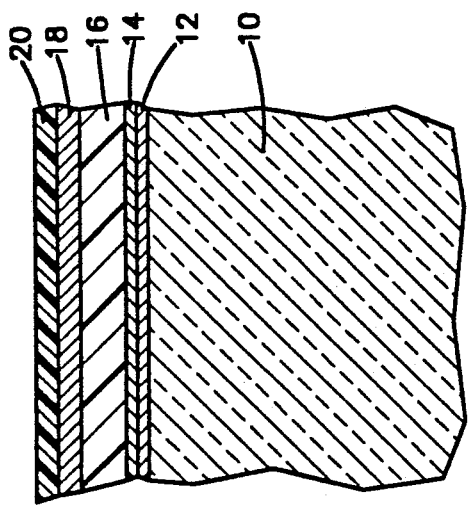
FIG. 5 is a view similar to FIG. 4 showing the resulting structure after reactive ion etching a deep trench.

During this reactive ion etching, as is shown diagrammatically in FIG. 5, those ions which are directed essentially perpendicular or normal to the surface of the substrate 10 impinge directly on the surface of the substrate, and hence, they etch essentially straight side walls in the substrate, the walls being a uniform distance apart to form a trench which is of uniform width with essentially straight side walls. The ions which are directed at an angle or are non-perpendicular to the substrate will either strike the polysilicon layer 16 which will absorb them and in fact cause an etching effect to take place similar to that taking place in the trench, or they will strike the face of the oxide mask 18 and be reflected therefrom into the polysilicon layer 16 which layer 16 will be sacrificially etched. The polysilicon layer 16 acts as an absorber or a sacrificial layer absorbing those ions which are not directed essentially vertical or normal to the surface of the silicon substrate, thus resulting in a trench etched in the substrate which is essentially uniform in width from the top to bottom and has essentially straight walls which are not bowed, any bowing or widening effect being limited to the layer of polysilicon 16 as shown in FIG. 5.

The thickness of the polysilicon layer 16 should be controlled to provide optimum results. If the layer of polysilicon is too thin, too much of the polysilicon layer 16 will be etched away or sacrificed before completion of the trench etching, and it will not be available to perform its function. In such case, erratic results, such as etching of the nitride or over etching of the top of the trench may occur. This is principally a function of the time etching takes place, which in turn together with the width of the trench determines the depth to which the trench will be etched.

In the case of trenches having a derived depth of about 10 $\mu$m and a derived width of about 0.5 $\mu$m, a thickness of the polysilicon of about 3 $\mu$m is preferred. In more general terms, if the aspect ratio (depth/width) is 20:1, the polysilicon layer 16 should be about 30% of the trench depth. Deeper or narrower trenches (i.e. those with a higher aspect ratio) require longer etch times and a thicker layer of polysilicon 16. Conversely, wider or shallower trenches (i.e. those with a lower aspect ratio) may use slightly thinner layers of polysilicon 16, although this layer must be thick enough to capture the non-normal ions so that initially no thickening or widening takes place at the top of the trench being etched due to non-normal ions. Relatively simple experimentation will reveal optimum thickness values of the polysilicon layer 16 for trenches of varying sizes and aspect ratios.

Figure 6:
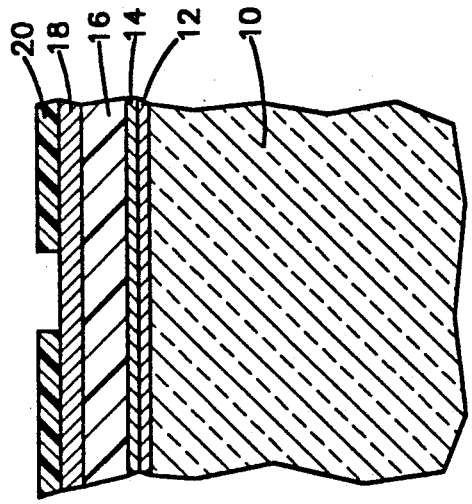
FIG. 6 is a view similar to FIG. 5 showing the final product with the etch mask material including the sacrificial layer removed.

Following the reactive ion etching of the trench to whatever depth is desired, the oxide mask layer can be stripped, e.g. in an AME 8100 tool utilizing a $CHF_3/CO_2$ atmosphere as previously described. If desired, following this, the trench can be given a dip in buffered hydrofluoric acid to clean any residues, after which the sacrificial layer of polysilicon 16 is removed. This can be done by any conventional method, the preferred method being done by chemical mechanical polishing. This type of polishing is described in U.S. Pat. No. 4,671,851 assigned to the present assignee. The remaining passivation layer of thermal oxide 12 and nitride 14 can be left in place with the resulting structure being shown in FIG. 6. In some cases, it may be advantageous to fill the trenches with either dielectric material or device forming material before removing the layer 16 of polysilicon and this can be accomplished by various techniques depending upon the material deposited.

Thus, by providing a sacrificial or buffer layer of a material which is the same as the substrate, a deep essentially uniform width, straight side wall trench can be reactive ion etched even though the ions from etching tool are not all directed perpendicular to the surface, those which are not perpendicular to the surface being absorbed by the layer of sacrificial material provided for that purpose.

It should be noted that the invention has been described in conjunction with reactive ion etching of silicon substrates. However, the invention can be used with reactive ion etching of other substrates it merely being necessary to utilize material as the sacrificial material which will absorb the same ions which etch the substrate and thus act as a sacrificial material to that particular material. Further, this material need not be the same composition as the substrate inasmuch as the only requirement is that the material absorbs the same ions that are used for reactive ion etching the substrate and that it can be removed once its purpose has been served. Indeed, this material need not even be etched if it can absorb the ions without being etched.

While one embodiment of this invention has been shown and described, various adaptations and modifications can be made without departing from the scope of the invention as defined in the appended claims.

What is claimed is:

1. A method of forming essentially uniform width deep trenches in a substrate by reactive ion etching, comprising of the steps of:
   forming an etch mask on the substrate that includes a first layer of material overlying the substrate that will react with or absorb the same ions which reactive ion etch the substrate, and forming a second layer of material on said first layer of material which will mask the ions used for reactive ion etching, and patterning said second layer to reveal portions of the first layer of materials and define the location and width of the trenches,
   reactive ion etching completely through the patterned exposed first layer of material and reactive ion etching the substrate therebelow to form the trenches in the substrate,
   whereby the exposed first layer of material beneath the second layer mask material absorbs or is etched by non-vertically travelling ions allowing only essentially vertically travelling ions to etch said substrate to an essentially uniform width.

2. The method as defined in claim 1 wherein the substrate is silicon.

3. The method as defined in claim 2 wherein the first layer of mask material is polysilicon.

4. The method as defined in claim 3 wherein the second layer of mask material is silicon dioxide.

5. The method as defined in claim 1 further characterized by said substrate including at least one layer of dielectric material on the surface thereof underlying said first layer of mask material.

6. The method as defined in claim 2 wherein the etch conditions for etching the trench in the substrate are selected such that essentially no passivation of the trench side walls in the substrate occurs during etching.

7. The method as defined in claim 2 wherein the aspect ratio of the trench is about 20:1 and the thickness of the first layer of material is about 30% of the depth of the trench.

8. The method as defined in claim 6, wherein a passivating layer is applied to the trench side walls.

9. The method as defined in claim 8, wherein said passivating layer includes silicon dioxide.

* * * * *